United States Patent
Poslavsky et al.

(10) Patent No.: US 10,648,793 B2
(45) Date of Patent: May 12, 2020

(54) LIBRARY EXPANSION SYSTEM, METHOD, AND COMPUTER PROGRAM PRODUCT FOR METROLOGY

(71) Applicant: KLA-Tencor Corporation, Milpitas, CA (US)

(72) Inventors: Leonid Poslavsky, Belmont, CA (US); Liequan Lee, Fremont, CA (US)

(73) Assignee: KLA-TENCOR CORPORATION, Milpitas, CA (US)

( * ) Notice: Subject to any disclaimer, the term of this patent is extended or adjusted under 35 U.S.C. 154(b) by 994 days.

(21) Appl. No.: 14/710,462

(22) Filed: May 12, 2015

(65) Prior Publication Data
US 2015/0330770 A1 Nov. 19, 2015

Related U.S. Application Data (60) Provisional application No. 61/993,571, filed on May 15, 2014.

(51) Int. Cl.
*G01B 11/02* (2006.01)
*G01B 11/00* (2006.01)
(Continued)

(52) U.S. Cl.
CPC .............. *G01B 11/02* (2013.01); *G01B 11/00* (2013.01); *G01B 21/04* (2013.01); *G01N 21/211* (2013.01); *G01N 21/9501* (2013.01); *G01N 21/95607* (2013.01); *G03F 7/70625* (2013.01); *G01N 2021/213* (2013.01); *G01N 2021/95615* (2013.01)

(58) Field of Classification Search
CPC ........ G01B 11/02; G01B 21/04; G01B 11/00; G01N 21/9501; G01N 21/95607; G01N 21/211; G01N 2021/213; G01N 2021/95615; G03F 7/70625
See application file for complete search history.

(56) References Cited

U.S. PATENT DOCUMENTS

| 5,608,526 A | 3/1997 | Piwonka-Corle et al. |
| 5,859,424 A | 1/1999 | Norton et al. |

(Continued)

FOREIGN PATENT DOCUMENTS

TW    I409657 B    9/2013

OTHER PUBLICATIONS

Wikipedia: Ellipsometery. https://web.archive.org/web/20130614035842/https://en.wikipedia.org/wiki/Ellipsometry, retrieved by Archive.org on Aug. 31, 2018 11:47:17 AM (Year: 2013).*

(Continued)

*Primary Examiner* — Alexander Satanovsky
*Assistant Examiner* — Mark I Crohn
(74) *Attorney, Agent, or Firm* — Zilka-Kotab, P.C.

(57) ABSTRACT

A library expansion system, method, and computer program product for metrology are provided. In use, processing within a first multi-dimensional library is performed by a metrology system. During the processing within the first multi-dimensional library, a second multi-dimensional library is identified. The processing is then transitioned to the second multi-dimensional library. Further, processing within the second multi-dimensional library is performed by the metrology system.

13 Claims, 8 Drawing Sheets

(51) Int. Cl.
*G01N 21/956* (2006.01)
*G01N 21/21* (2006.01)
*G03F 7/20* (2006.01)
*G01B 21/04* (2006.01)
*G01N 21/95* (2006.01)

(56) References Cited

U.S. PATENT DOCUMENTS

| | | |
|---|---|---|
| 6,429,943 B1 | 8/2002 | Opsal et al. |
| 7,478,019 B2 | 1/2009 | Zangooie et al. |
| 7,542,859 B2 | 6/2009 | Funk et al. |
| 7,993,026 B2 | 8/2011 | Yoon et al. |
| 8,381,140 B2 | 2/2013 | Hench et al. |
| 8,543,557 B2 | 9/2013 | Aikens et al. |
| 2005/0182592 A1* | 8/2005 | Aikens .................. G01N 21/47 702/155 |
| 2005/0274901 A1* | 12/2005 | Fabrikant ............... G01N 21/21 250/397 |
| 2011/0288822 A1 | 11/2011 | Veldman et al. |
| 2012/0210289 A1* | 8/2012 | Hench ................. G03F 7/70491 716/122 |
| 2012/0226644 A1* | 9/2012 | Jin ........................ G06N 3/0454 706/19 |
| 2013/0110477 A1 | 5/2013 | Pandev |
| 2013/0144560 A1 | 6/2013 | Pisarenco et al. |
| 2013/0305206 A1 | 11/2013 | Pandev |
| 2014/0111791 A1 | 4/2014 | Manassen et al. |
| 2014/0172394 A1 | 6/2014 | Kuznetsov et al. |
| 2014/0222380 A1 | 8/2014 | Kuznetsov et al. |

OTHER PUBLICATIONS

U.S. Appl. No. 14/294,540, filed Jun. 3, 2014.
International Search Report from International Application No. PCT/US2015/031015, dated Aug. 17, 2015.

* cited by examiner

Fig. 8

LIBRARY EXPANSION SYSTEM, METHOD, AND COMPUTER PROGRAM PRODUCT FOR METROLOGY

RELATED APPLICATION(S)

This application claims the benefit of U.S. Provisional Patent Application No. 61/993,571 filed May 15, 2014, the entire contents of which are incorporated herein by reference.

FIELD OF THE INVENTION

The present invention relates to metrology systems, and more particularly to libraries used in metrology systems.

BACKGROUND

Metrology generally involves measuring various physical features of a target component. For example, structural and material characteristics (e.g. material composition, dimensional characteristics of structures and/or critical dimensions of structures, etc.) of the target component can be measured using metrology systems. In the example of semiconductor metrology, various physical features of a fabricated semiconductor component may be measured using a metrology system.

Once a metrology measurement is obtained, the measurement may be analyzed. This analysis typically involves a library having predefined value(s) for parameters specific to the target component (i.e. a parametric model of the target component). In particular, the library may include value ranges for floating parameters. The library may then be used to provide a fast mathematical approximation that can quickly reproduce the solution of a system having the target component with a reasonable accuracy, given the set of values for the parametric model.

Unfortunately, current library implementations in metrology systems exhibit various limitations. For example, when value ranges of multiple parameters (i.e. floating parameters) are large, the traditional library generated often has, in general, poor quality and poor performance.

There is thus a need for dealing with large value ranges of multiple parameters in determining target component measurements through a metrology system, and well as addressing any other issues associated with the prior art implementations of libraries used in metrology systems.

SUMMARY

A library expansion system, method, and computer program product for metrology are provided. In use, processing within a first multi-dimensional library is performed by a metrology system. During the processing within the first multi-dimensional library, a second multi-dimensional library is identified. The processing is then transitioned to the second multi-dimensional library. Further, processing within the second multi-dimensional library is performed by the metrology system.

DETAILED DESCRIPTION

In the field of semiconductor metrology, a metrology tool may comprise an illumination system which illuminates a target, a collection system which captures relevant information provided by the illumination system's interaction (or lack thereof) with a target, device or feature, and a processing system which analyzes the information collected using one or more algorithms. Metrology tools can be used to measure structural and material characteristics (e.g. material composition, dimensional characteristics of structures and films such as film thickness and/or critical dimensions of structures, overlay, etc.) associated with various semiconductor fabrication processes. These measurements are used to facilitate process controls and/or yield efficiencies in the manufacture of semiconductor dies.

The metrology tool can comprise one or more hardware configurations which may be used in conjunction with certain embodiments of this invention to, e.g., measure the various aforementioned semiconductor structural and material characteristics. Examples of such hardware configurations include, but are not limited to, the following.

Spectroscopic ellipsometer (SE)
SE with multiple angles of illumination
SE measuring Mueller matrix elements (e.g. using rotating compensator(s))
Single-wavelength ellipsometers
Beam profile ellipsometer (angle-resolved ellipsometer)
Beam profile reflectometer (angle-resolved reflectometer)
Broadband reflective spectrometer (spectroscopic reflectometer)
Single-wavelength reflectometer
Angle-resolved reflectometer
Imaging system
Scatterometer (e.g. speckle analyzer)

Figure 1:
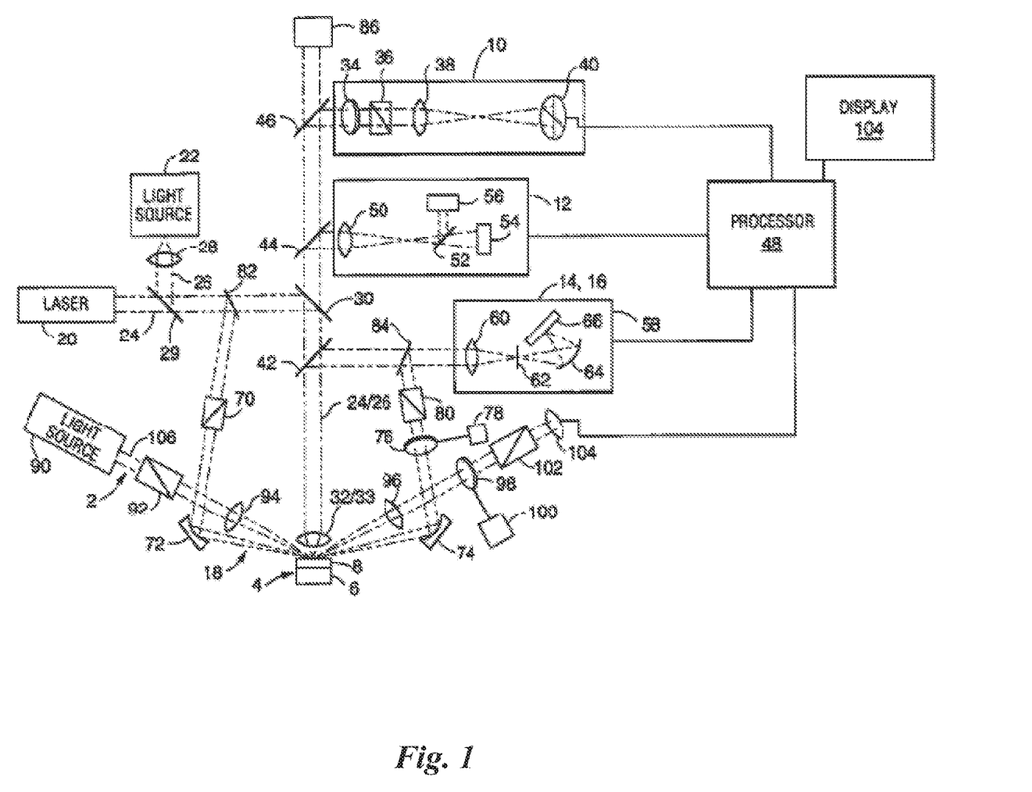
FIG. 1 shows a schematic of an exemplary metrology tool, in accordance with the prior art.

The hardware configurations can be separated into discrete operational systems. On the other hand, one or more hardware configurations can be combined into a single tool. One example of such a combination of multiple hardware configurations into a single tool is shown in FIG. 1, incorporated herein from U.S. Pat. No. 7,933,026 which is hereby incorporated by reference in its entirety for all purposes. FIG. 1 shows, for example, a schematic of an exemplary metrology tool that comprises: a) a broadband SE (i.e., 18); b) a SE (i.e., 2) with rotating compensator (i.e., 98); c) a beam profile ellipsometer (i.e., 10); d) a beam profile reflectometer (i.e., 12); e) a broadband reflective spectrometer (i.e., 14); and f) a deep ultra-violet reflective spectrometer (i.e., 16). In addition, there are typically numerous optical elements in such systems, including certain lenses, collimators, mirrors, quarter-wave plates, polarizers, detectors, cameras, apertures, and/or light sources. The wavelengths for optical systems can vary from about 120 nm to 3 microns. For non-ellipsometer systems, signals collected can be polarization-resolved or unpolarized. FIG. 1 provides an illustration of multiple metrology heads integrated on the same tool. However, in many cases, multiple metrology tools are used for measurements on a single or multiple metrology targets. This is described, for example, in U.S. Pat. No. 7,478,019, "Multiple tool and structure analysis," which is also hereby incorporated by reference in its entirety for all purposes.

The illumination system of the certain hardware configurations includes one or more light sources. The light source may generate light having only one wavelength (i.e., monochromatic light), light having a number of discrete wavelengths (i.e., polychromatic light), light having multiple wavelengths (i.e., broadband light) and/or light the sweeps through wavelengths, either continuously or hopping between wavelengths (i.e. tunable sources or swept source). Examples of suitable light sources are: a white light source, an ultraviolet (UV) laser, an arc lamp or an electrode-less lamp, a laser sustained plasma (LSP) source, for example those commercially available from Energetiq Technology, Inc., Woburn, Mass., a super-continuum source (such as a broadband laser source) such as those commercially available from NKT Photonics Inc., Morganville, N.J., or shorter-wavelength sources such as x-ray sources, extreme UV sources, or some combination thereof. The light source may also be configured to provide light having sufficient brightness, which in some cases may be a brightness greater than about 1 W/(nm cm$^2$ Sr). The metrology system may also include a fast feedback to the light source for stabilizing its power and wavelength. Output of the light source can be delivered via free-space propagation, or in some cases delivered via optical fiber or light guide of any type.

The metrology tool is designed to make many different types of measurements related to semiconductor manufacturing. Certain embodiments may be applicable to such measurements. For example, in certain embodiments the tool may measure characteristics of one or more targets, such as critical dimensions, overlay, sidewall angles, film thicknesses, process-related parameters (e.g., focus and/or dose). The targets can include certain regions of interest that are periodic in nature, such as for example gratings in a memory die. Targets can include multiple layers (or films) whose thicknesses can be measured by the metrology tool. Targets can include target designs placed (or already existing) on the semiconductor wafer for use, e.g., with alignment and/or overlay registration operations. Certain targets can be located at various places on the semiconductor wafer. For example, targets can be located within the scribe lines (e.g., between dies) and/or located in the die itself. In certain embodiments, multiple targets are measured (at the same time or at differing times) by the same or multiple metrology tools as described in U.S. Pat. No. 7,478,019. The data from such measurements may be combined. Data from the metrology tool is used in the semiconductor manufacturing process for example to feed-forward, feed-backward and/or feed-sideways corrections to the process (e.g. lithography, etch) and therefore, might yield a complete process control solution.

As semiconductor device pattern dimensions continue to shrink, smaller metrology targets are often required. Furthermore, the measurement accuracy and matching to actual device characteristics increase the need for device-like targets as well as in-die and even on-device measurements. Various metrology implementations have been proposed to achieve that goal. For example, focused beam ellipsometry based on primarily reflective optics is one of them and described in the patent by Piwonka-Corle et al. (U.S. Pat. No. 5,608,526, "Focused beam spectroscopic ellipsometry method and system"). Apodizers can be used to mitigate the effects of optical diffraction causing the spread of the illumination spot beyond the size defined by geometric optics. The use of apodizers is described in the patent by Norton, U.S. Pat. No. 5,859,424, "Apodizing filter system useful for reducing spot size in optical measurements and other applications". The use of high-numerical-aperture tools with simultaneous multiple angle-of-incidence illumination is another way to achieve small-target capability. This technique is described, e.g. in the patent by Opsal et al, U.S. Pat. No. 6,429,943, "Critical dimension analysis with simultaneous multiple angle of incidence measurements".

Other measurement examples may include measuring the composition of one or more layers of the semiconductor stack, measuring certain defects on (or within) the wafer, and measuring the amount of photolithographic radiation exposed to the wafer. In some cases, metrology tool and algorithm may be configured for measuring non-periodic targets, see e.g. "The Finite Element Method for Full Wave Electromagnetic Simulations in CD Metrology Using Scatterometry" by P. Jiang et al (pending U.S. patent application Ser. No. 14/294,540, filed Jun. 3, 2014) or "Method of electromagnetic modeling of finite structures and finite illumination for metrology and inspection" by A. Kuznetsov et al. (pending U.S. patent application Ser. No. 14/170,150).

Measurement of parameters of interest usually involves a number of algorithms. For example, optical interaction of the incident beam with the sample is modeled using EM (electro-magnetic) solver and uses such algorithms as RCWA, FEM, method of moments, surface integral method, volume integral method, FDTD, and others. The target of interest is usually modeled (parameterized) using a geometric engine, or in some cases, process modeling engine or a combination of both. The use of process modeling is described in "Method for integrated use of model-based metrology and a process model," by A. Kuznetsov et al. (pending U.S. patent application Ser. No. 14/107,850). A geometric engine is implemented, for example, in AcuShape software product of KLA-Tencor.

Collected data can be analyzed by a number of data fitting and optimization techniques an technologies including libraries, Fast-reduced-order models; regression; machine-learning algorithms such as neural networks, support-vector machines (SVM); dimensionality-reduction algorithms such as, e.g., PCA (principal component analysis), ICA (independent component analysis), LLE (local-linear embedding); sparse representation such as Fourier or wavelet transform; Kalman filter; algorithms to promote matching from same or different tool types, and others.

Collected data can also be analyzed by algorithms that do not include modeling, optimization and/or fitting e.g. U.S. patent application Ser. No. 14/057,827.

Computational algorithms are usually optimized for metrology applications with one or more approaches being used such as design and implementation of computational hardware, parallelization, distribution of computation, load-balancing, multi-service support, dynamic load optimization, etc. Different implementations of algorithms can be done in firmware, software, FPGA, programmable optics components, etc.

The data analysis and fitting steps usually pursue one or more of the following goals:

Measurement of CD, SWA, shape, stress, composition, films, band-gap, electrical properties, focus/dose, overlay, generating process parameters (e.g., resist state, partial pressure, temperature, focusing model), and/or any combination thereof;

Modeling and/or design of metrology systems;

Modeling, design, and/or optimization of metrology targets.

The following description discloses embodiments of a library expansion system, method, and computer program product (embodied on a non-transitory computer readable medium) which may be implemented in the context of the semiconductor metrology tool described above, or which may be implemented in the context of other metrology tools.

Figure 2:
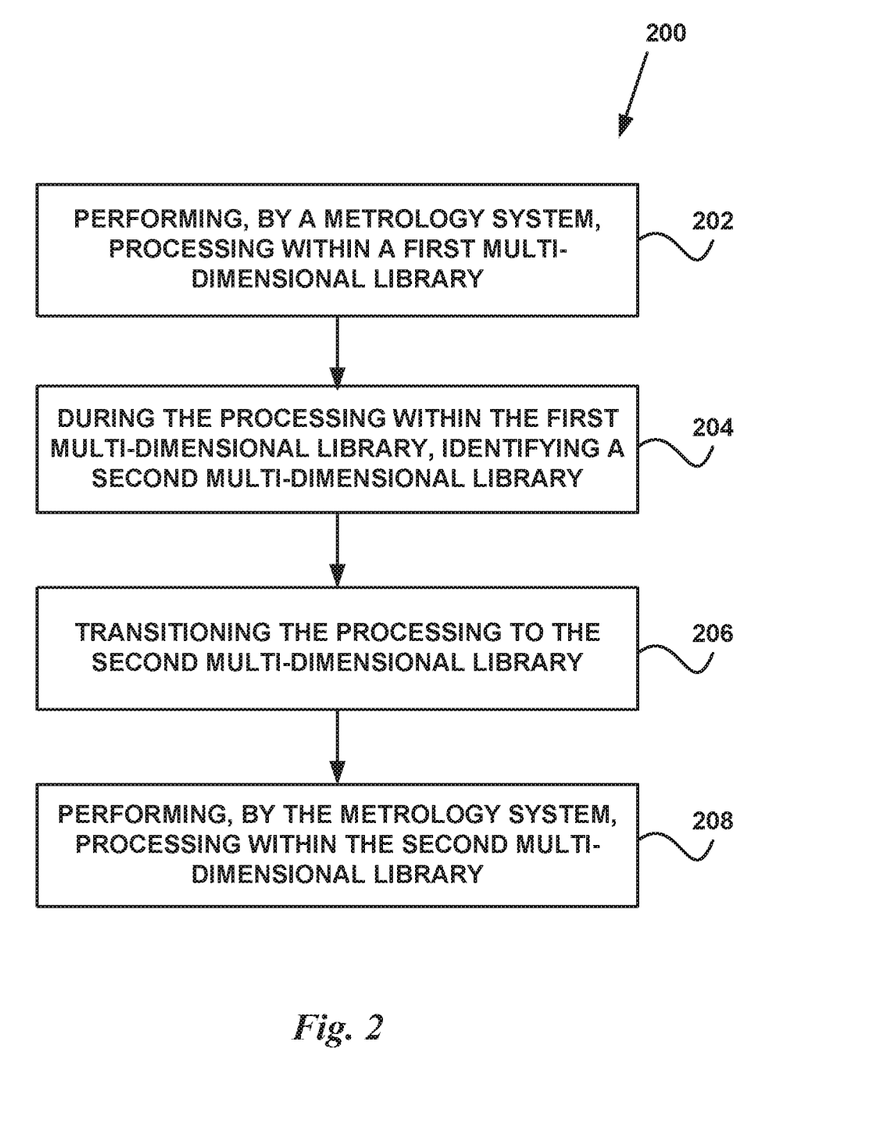
FIG. 2 illustrates a library expansion method for a metrology system, in accordance with an embodiment.

FIG. 2 illustrates a library expansion method 200 for a metrology system, in accordance with an embodiment. As shown in operation 202, processing within a first multi-dimensional library is performed by a metrology system. In the context of the present description, the first multi-dimensional library may be any library having two or more dimensions and storing one or more values for one or more parameters of a target component being analyzed by the metrology system. Thus, the first multi-dimensional library may represent at least a portion of a parametric model of the target component.

Moreover, the processing within the first multi-dimensional library may include any spectra evaluation that utilizes parameter values stored in the first multi-dimensional library. For example, for any given parameter value (e.g. measured using the metrology system) that is within the first multi-dimensional library, the spectra may be calculated using the first multi-dimensional library. Thus, the method 200 may be initiated to evaluate spectra for measured values for the a particular parameter of the parametric model.

Additionally, in operation 204, during the processing within the first multi-dimensional library, a second multi-dimensional library is identified. Similar to the first multi-dimensional library, the second multi-dimensional library may be any library having two or more dimensions and storing one or more values for one or more parameters of the target component. However, the parameter value(s) in the second multi-dimensional library, at least in part, differ from the value(s) in the first multi-dimensional library. Thus, the second multi-dimensional library may represent a different portion of the parametric model of the target component.

In one embodiment, the second multi-dimensional library may be embedded in the first multi-dimensional library. In this case, the second multi-dimensional library may be referred to an inner library and the first multi-dimensional library may be referred to as an outer library. With respect to this embodiment, the second multi-dimensional library may include a first range of values for at least one parameter that is a subset of a second range of values for the at least one parameter within the first multi-dimensional library.

Assuming that the accuracy of the parameter values at different locations within the range of values for the parameter can be different, in the center of the range the accuracy of the parameter value is higher than outside of the center such that it is degraded at the edge or corner of the range. Thus, in furtherance of the above embodiment where the first range of values in the second multi-dimensional library are near or at the center of the second range in the first multi-dimensional library, the first range of values in the second multi-dimensional library (i.e. the inner library) may have a higher accuracy than the second range of values in the first multi-dimensional library (i.e. the outer library). Furthermore, it should be noted that the second range of values for the at least one parameter within the first multi-dimensional library may include all predefined values for the at least one parameter. In yet another, the second multi-dimensional library may be the outer library (e.g. with lower accuracy) and the first multi-dimensional library may be the inner library (e.g. with higher accuracy).

In another embodiment, the first multi-dimensional library may be non-overlapping with the second multi-dimensional library. In particular, the first multi-dimensional library may include a first range of values for one or more parameters that is non-overlapping with a second range of values for the parameter(s) within the second multi-dimensional library. In this case, the first multi-dimensional library and the second multi-dimensional library may each be high a accuracy library. As an option to this embodiment, the first and second multi-dimensional libraries may or may not be implemented within a lower accuracy outer library. In a further example of the non-overlapping first and second libraries, the first range of values in the first multi-dimensional library may be the same size as, or a different size than, the second range of values in the second multi-dimensional library.

In yet another embodiment, the first multi-dimensional library and the second multi-dimensional library may overlap in part. Specifically, the first multi-dimensional library may include a first range of values for one or more parameters that overlaps in part with a second range of values for the parameter(s) within the second multi-dimensional library.

In any of the above embodiments, it should be noted that the first multi-dimensional library and the second multi-dimensional library may be constructed using the same or different methods, such as finite element methods (FEM) and rigorous coupled-wave analysis (RCWA). Additionally, the first multi-dimensional library and the second multi-dimensional library may be constructed with the same or different method parameters, such as a truncation order in RCWA and a polynomial order in FEM.

As noted above in operation 204, during the processing within the first multi-dimensional library, the second multi-dimensional library is identified. This may occur when a given parameter value (e.g. measured using the metrology system) to be subject to the spectra evaluation is identified as being within the second multi-dimensional library.

Once the second multi-dimensional library is identified, the processing is then transitioned in operation 206 to the second multi-dimensional library. In one embodiment, the transition may non-continuous (i.e. not smooth). In this embodiment, the metrology system may immediately move from processing within the first multi-dimensional library to processing within the second multi-dimensional library.

In another embodiment, the transition may be continuous (i.e. smooth) by implementing a predefined transition function. The predefined transition function may also be multi-dimensional and include a subset of values for the parameter(s) included in both the first multi-dimensional library and the second multi-dimensional library, in which case processing may be performed by the metrology system within the transition function. Namely, the spectra may be calculated with the transition function for any given measured values that are within the predefined transition function.

Further, in operation 208, processing within the second multi-dimensional library is performed by the metrology system. As noted above, the processing within the second multi-dimensional library may be performed immediately subsequent to the processing within the first multi-dimensional library, or following the processing within the transition function.

As similarly described above, this processing within the second multi-dimensional library may include a spectra evaluation that utilizes parameter values stored in the second multi-dimensional library. For example, for any given parameter value (e.g. measured using the metrology system) that is within the second multi-dimensional library, the spectra may be calculated using the second multi-dimensional library.

To this end, processing by the metrology system may involve an expanded library comprised of both the first library and the second library. It should be noted that one or more further multi-dimensional libraries to the two described above may also be similarly created and utilized by the metrology system. The additional libraries may be inner to, outer to, partially overlapping, or non-overlapping with the first and second multi-dimensional libraries, and they may be implemented by repeating the operations of FIG. 2 with respect to any two of the libraries.

Moreover, processing within the additional libraries may occur prior to the processing within the first multi-dimensional library or after the processing within the first multi-dimensional library, but in any case the metrology system may transition from processing within one library to the next as appropriate to the given parameter for which the spectra is being evaluated. Just by way of example, during the processing within the second multi-dimensional library, a third multi-dimensional library may be identified, the processing by the metrology system may transition (e.g. continuously or not) to the third multi-dimensional library, and processing within the third multi-dimensional library may be performed by the metrology system. Furthermore, processing by the metrology system may loop back to being performed within any of the libraries (e.g. from the second multi-dimensional library back to the first multi-dimensional library, etc.), again, dependent the given parameter for which the spectra is being evaluated.

In this way, the first multi-dimensional library may be a base library and the second multi-dimensional library may be created as an expansion or supplement to that base library, or vice versa. Further, any number of additional multi-dimensional libraries may also be created, at any point in time, to supplement existing multi-dimensional libraries being implemented by the metrology system. This may allow for the metrology system to be updated, as desired, with additional multi-dimensional libraries without requiring any changes to be made to the multi-dimensional library or libraries already implemented by the metrology system. For example, the metrology system, when created, may be configured to be able to transition between any existing multi-dimensional library and any later implemented multi-dimensional library.

In various embodiments, the above method 200 may allow for:

libraries that can measure critical dimensions (CDs) with a wide parameter range;

libraries that can measure CDs with an adaptive accuracy in different locations of the parameter range;

libraries that can measure CDs calculated from different libraries with different parameter ranges;

Further, the method 200 may be used with tools such as ellipsometers and reflectometers, which can be spectroscopic, single-wavelength, multiple angles of incidence, angle-resolved or any meaningful combination thereof. The method 200 may also be used in CD, Film or model based Overlay metrology.

Figure 3A:
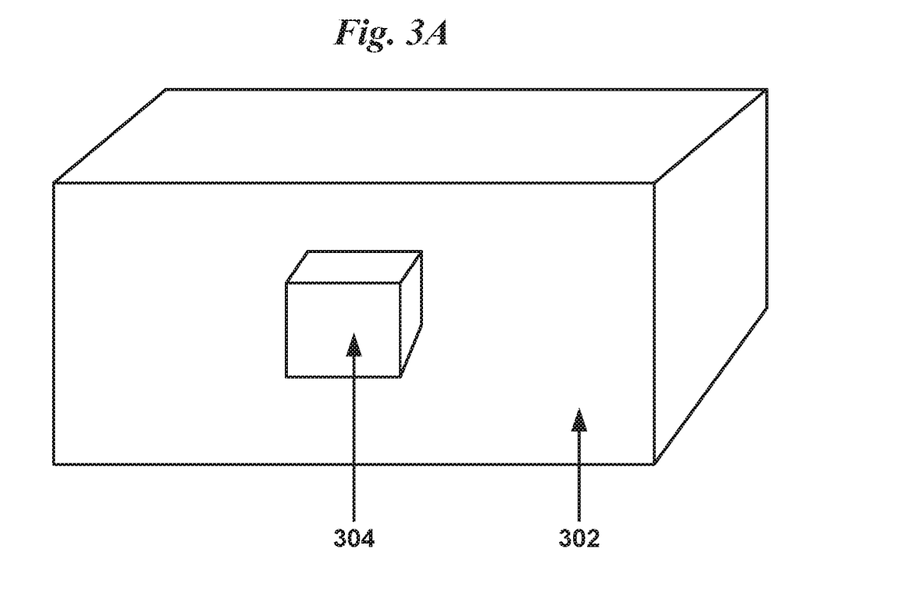
FIGS. 3A-B illustrate configurations for the first and second multi-dimensional libraries, in accordance with another embodiment.

FIGS. 3A-B illustrates configurations for the first and second multi-dimensional libraries, in accordance with another embodiment. It should be noted that the definitions above may equally apply to the following description. In FIG. 3A, an expanded library implemented by a metrology system includes an outer multi-dimensional library 302 and an inner multi-dimensional library 304. Processing by the metrology system may transition from the outer multi-dimensional library 302 to the inner multi-dimensional library 304 and/or vice versa.

Figure 3B:
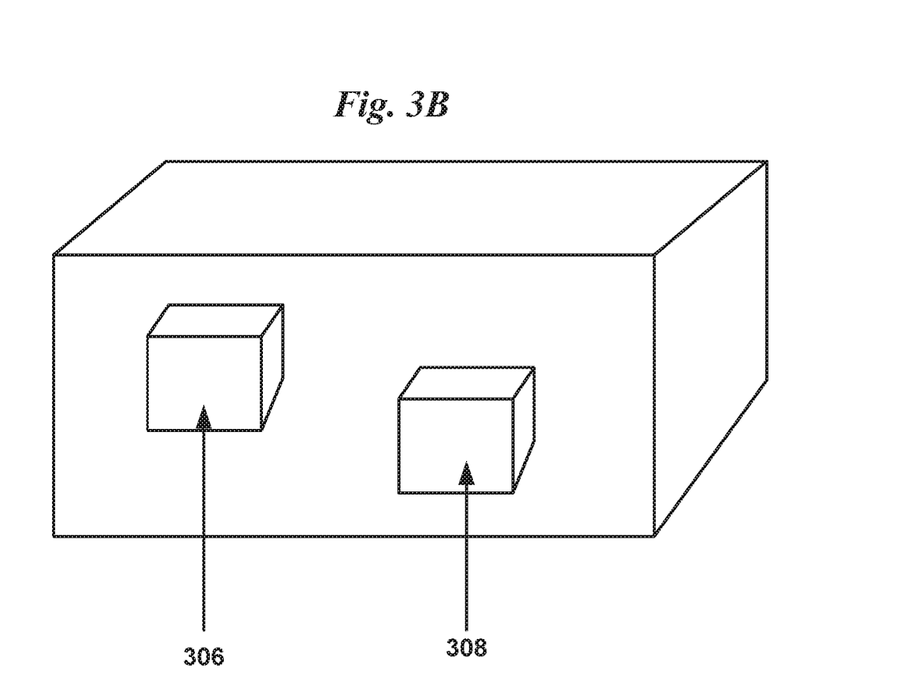

In FIG. 3B, an expanded library implemented by a metrology system includes two inner multi-dimensional libraries 306 and 308. While shown in inside of a larger box, it should be noted that the two inner multi-dimensional libraries 306 and 308 may or may not be implemented in the context of a lower accuracy outer library. As also shown, the two inner multi-dimensional libraries 306 and 308 are shown as being non-overlapping, but other embodiments are considered in which the two inner multi-dimensional libraries 306 and 308 may be overlapping in part. Of course more than two inner multi-dimensional libraries may also be provided (e.g. within a same outer library, etc.), and transitioning between the inner/outer libraries may be enabled as described above with reference to FIG. 2.

Figure 4:
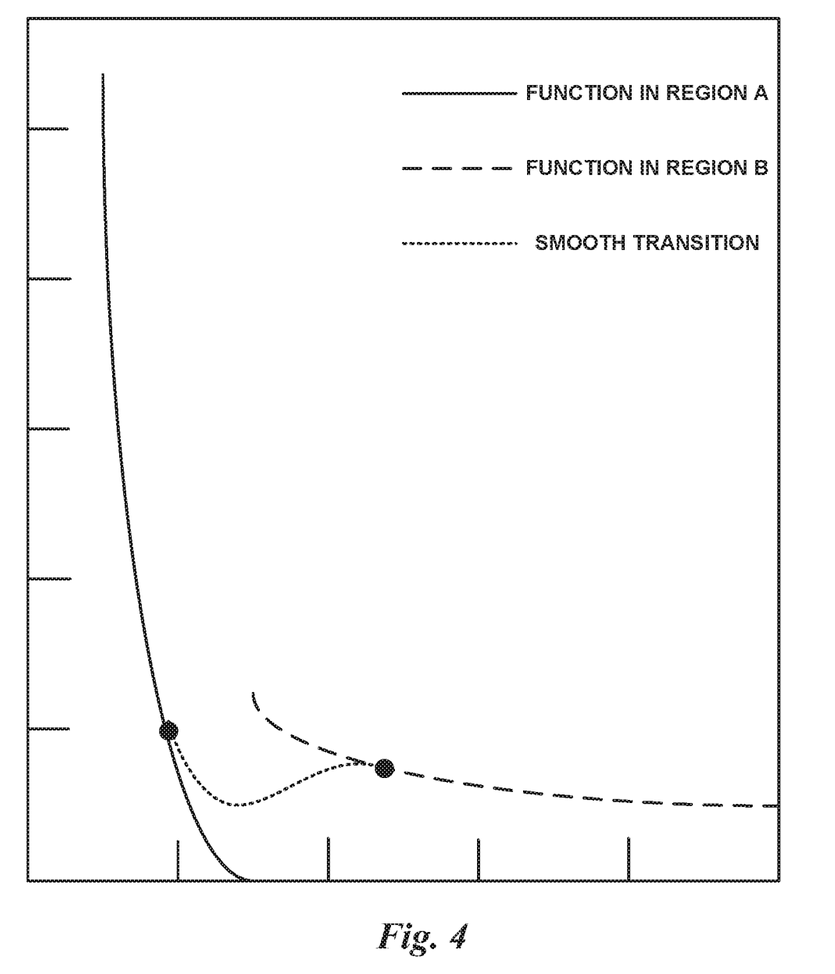
FIG. 4 illustrates a transition function implemented between a first multi-dimensional library and second multi-dimensional library

FIG. 4 illustrates a transition function implemented between a first multi-dimensional library and second multi-dimensional library, in accordance with another embodiment. As shown, processing by the metrology system transitions from a function in Region A (i.e. a first multi-dimensional library) to a function in Region B (i.e. a second multi-dimensional library). This transition function enables a smooth transition when processing from within Region A to within Region B. Without the transition function, the transition from processing within Region A to within Region B is non-continuous.

Proof of Concept

Figure 5:
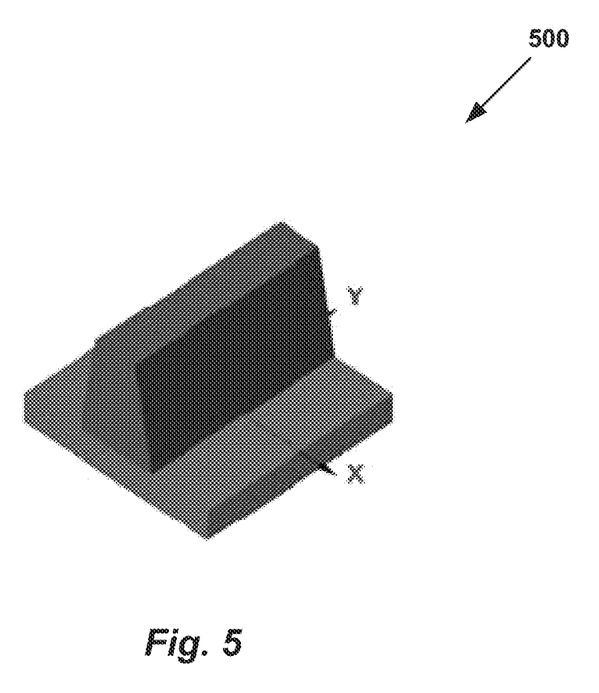
FIG. 5 illustrates an arbitrary target component, in accordance with yet another embodiment.

FIG. 5 illustrates an arbitrary target component, in accordance with yet another embodiment. The arbitrary target component may be a component under measurement by the metrology system.

Table 1 below shows boundary values of the inner library and expanded zone for each parameter of the arbitrary target component of FIG. 5.

|  | MCD | | SWA | | HT | |
| --- | --- | --- | --- | --- | --- | --- |
|  | Min | Max | Min | Max | Min | Max |
| Inner zone | 40 | 80 | 60 | 100 | 80 | 120 |
| Expanded zone | 20 | 100 | 40 | 120 | 60 | 140 |

An inner library and outer library were separately constructed, and then composited together with high-dimensional transitional functions to produce an "expanded library". The quality of the expanded library was then evaluated.

Figure 6:
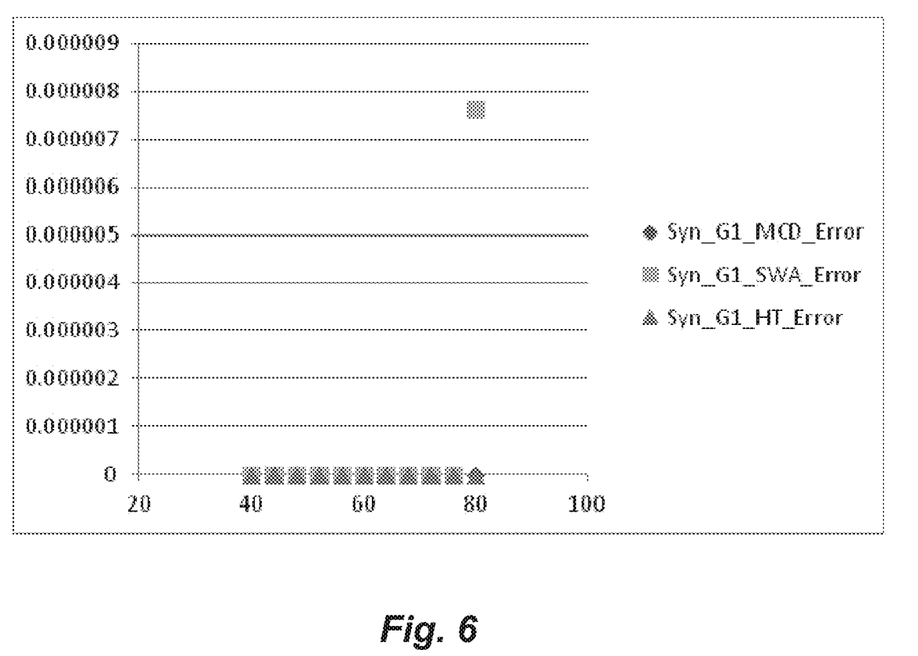
FIG. 6 illustrates results for a first arbitrary parameter of FIG. 5 using each of an expanded library and an inner library portion of the expanded library, in accordance with still yet another embodiment.

First a set of synthetic spectra were constructed with SWA and HT fixed at the center while changing MCD from its minimal value to the maximal value (so called drill-through test). Library validation was then run with the inner library and the expanded library, respectively. The difference of parameter errors was then compared. FIG. 6 shows the results for the first arbitrary parameter of FIG. 5 (MCD) using each of the expanded library and an inner library portion of the expanded library. It shows that inside the region of inner library zone, the parameter results from library validation using the expanded library are identical to those using the inner library.

Figure 7:
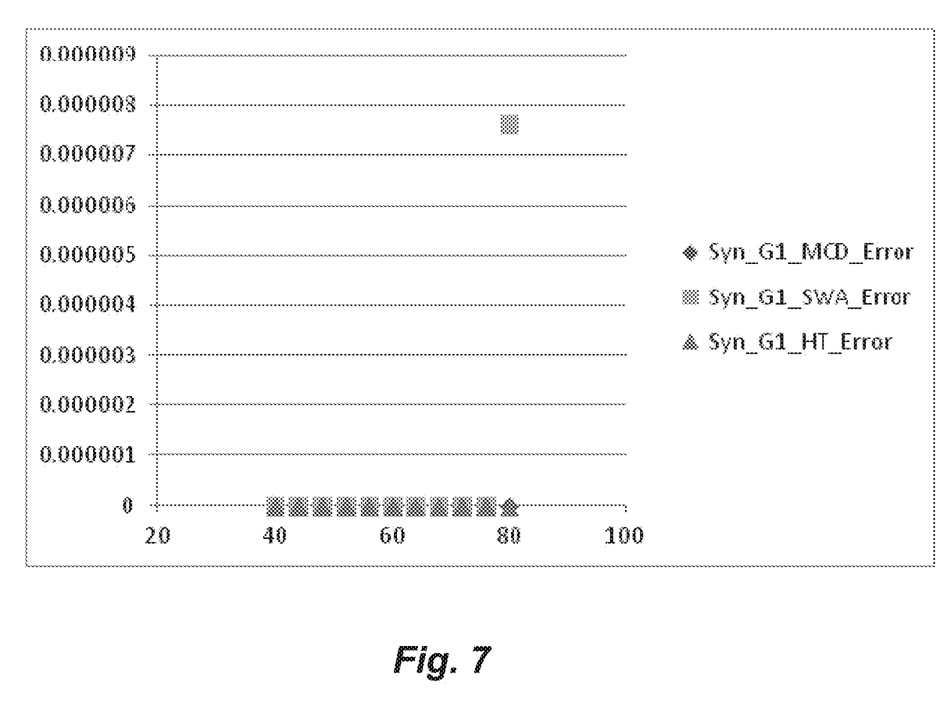
FIG. 7 illustrates results for a second arbitrary parameter of FIG. 5 using each of an expanded library and an inner library portion of the expanded library, in accordance with another embodiment.
Figure 8:
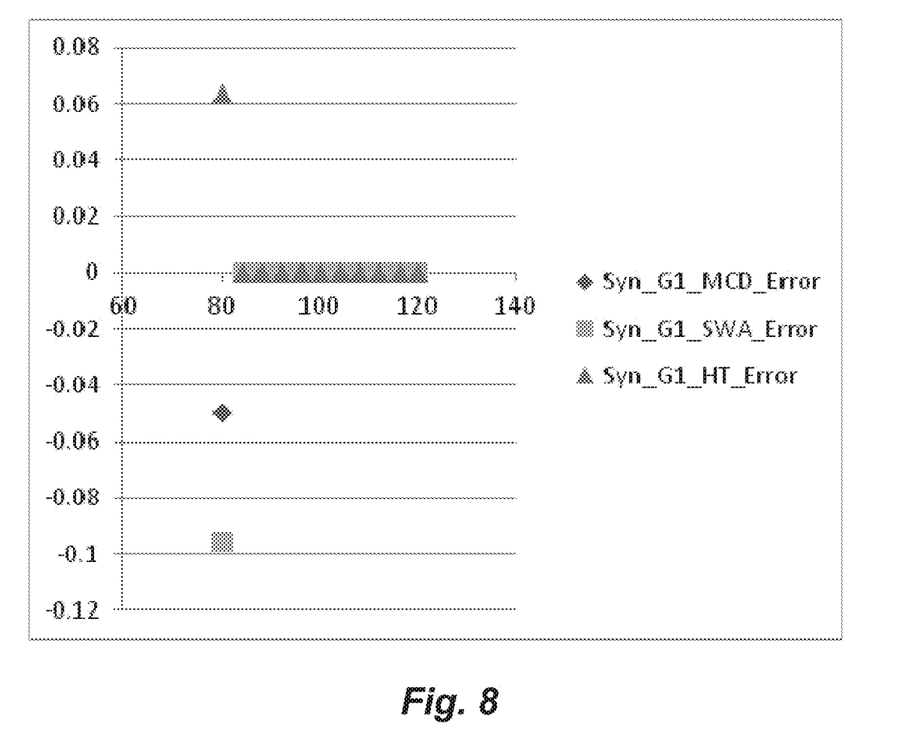
FIG. 8 illustrates results for a third arbitrary parameter of FIG. 5 using each of an expanded library and an inner library portion of the expanded library, in accordance with another embodiment.

A similar drill-through test for parameter SWA and HT were also performed. The results are shown in FIGS. 7 and 8, respectively. They draw the same conclusion, namely that inside the region of inner library zone, the parameter results from library validation using the expanded library are identical to those using the inner library.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
   storing, in memory of a metrology system:
   a first multi-dimensional library that represents a first portion of a parametric model of a fabricated device, the first multi-dimensional library having a first set of values for each parameter of a plurality of parameters of the fabricated device where each first set of values is of a first range,
   a second multi-dimensional library having a second set of values for a first one of the parameters of the fabricated device, the second set of values being of a second range that is within the first range and the second set of values having a higher accuracy than the first set of values, and
   a third multi-dimensional library having a third set of values for a second one of the parameters of the fabricated device, the third set of values being of a third range that is within the first range and the third set of values having a higher accuracy than the first set of values;
   illuminating, by a light source of the metrology system, the fabricated device;
   receiving, by a detector of the metrology system, light reflected from the fabricated device as a result of the illuminating;
   generating, by the detector of the metrology system, output responsive to the received light, the output including a plurality of parameter values measured for the parameters of the fabricated device; and
   providing, by the detector of the metrology system, the output to a computer system of the metrology system for processing thereof including a spectra evaluation of the output to measure critical dimensions of the fabricated device;
   in response to the computer system receiving the output from the detector, identifying, by the computer system of the metrology system, the first multi-dimensional library;
   performing, by the computer system of the metrology system, the processing of a first parameter value of the plurality of parameter values that is within the first multi-dimensional library to produce a spectra for the first parameter value using the first multi-dimensional library;
   during the processing within the first multi-dimensional library, identifying, by the computer system of the metrology system, a second parameter value of the plurality of parameter values that is within the second multi-dimensional library;
   transitioning, by the computer system of the metrology system, the processing to the second multi-dimensional library;
   performing, by the computer system of the metrology system, the processing of the second parameter value within the second multi-dimensional library to produce a spectra for the second parameter value using the second multi-dimensional library;
   during the processing within the second multi-dimensional library, identifying, by the computer system of the metrology system, a third parameter value of the plurality of parameter values that is within the third multi-dimensional library;
   transitioning, by the computer system of the metrology system, the processing to the third multi-dimensional library; and
   performing, by the computer system of the metrology system, the processing of the third parameter value within the third multi-dimensional library to produce a spectra for the third parameter value using the third multi-dimensional library.

2. The method of claim 1, wherein each of the first multi-dimensional library and the second multi-dimensional library are constructed using one of finite element methods (FEM) and rigorous coupled-wave analysis (RCWA).

3. The method of claim 2, wherein each of the first multi-dimensional library and the second multi-dimensional library are constructed with method parameters including one of a truncation order in RCWA and a polynomial order in FEM.

4. The method of claim 1, wherein transitioning the processing to the second multi-dimensional library is performed using a predefined transition function.

5. The method of claim 1, wherein the second multi-dimensional library is created as a supplement to the first multi-dimensional library.

6. The method of claim 1, wherein the metrology system is a semiconductor metrology system.

7. A non-transitory computer readable medium storing a computer program product including computer code adapted to be executed by a processor of a metrology system to cause the processor to perform a method, comprising:
   storing, in memory of a metrology system:
   a first multi-dimensional library that represents a first portion of a parametric model of a fabricated device, the first multi-dimensional library having a first set of values for each parameter of a plurality of parameters of the fabricated device where each first set of values is of a first range,
   a second multi-dimensional library having a second set of values for a first one of the parameters of the fabricated device, the second set of values being of a second range that is within the first range and the second set of values having a higher accuracy than the first set of values, and
   a third multi-dimensional library having a third set of values for a second one of the parameters of the fabricated device, the third set of values being of a third range that is within the first range and the third set of values having a higher accuracy than the first set of values;

causing a light source of a metrology system to illuminate the fabricated device such that a detector of the metrology system receives light reflected from the fabricated device as a result of the illuminating;

generating, by the detector of the metrology system, output responsive to the received light, the output including a plurality of parameter values measured for the parameters of the fabricated device; and providing, by the detector of the metrology system, the output to the processor of the metrology system for processing thereof including a spectra evaluation of the output to measure critical dimensions of the fabricated device;

in response to the processor receiving the output from the detector, identifying, by the processor of the metrology system, the first multi-dimensional library;

performing, by the processor of the metrology system, the processing of a first parameter value of the plurality of parameter values that is within the first multi-dimensional library to produce a spectra for the first parameter value using the first multi-dimensional library;

during the processing within the first multi-dimensional library, identifying, by the processor of the metrology system, a second parameter value of the plurality of parameter values that is within the second multi-dimensional library;

transitioning, by the processor of the metrology system, the processing to the second multi-dimensional library;

performing, by the processor of the metrology system, the processing of the second parameter value within the second multi-dimensional library to produce a spectra for the second parameter value using the second multi-dimensional library;

during the processing within the second multi-dimensional library, identifying, by the processor of the metrology system, a third parameter value of the plurality of parameter values that is within the third multi-dimensional library;

transitioning, by the processor of the metrology system, the processing to the third multi-dimensional library; and performing, by the processor of the metrology system, the processing of the third parameter value within the third multi-dimensional library to produce a spectra for the third parameter value using the third multi-dimensional library.

8. A metrology system, comprising:
memory storing:
a first multi-dimensional library that represents a first portion of a parametric model of a fabricated device, the first multi-dimensional library having a first set of values for each parameter of a plurality of parameters of the fabricated device where each first set of values is of a first range,
a second multi-dimensional library having a second set of values for a first one of the parameters of the fabricated device, the second set of values being of a second range that is within the first range and the second set of values having a higher accuracy than the first set of values, and
a third multi-dimensional library having a third set of values for a second one of the parameters of the fabricated device, the third set of values being of a third range that is within the first range and the third set of values having a higher accuracy than the first set of values;

a light source for illuminating the fabricated device;
a detector for:
receiving light reflected from the fabricated device as a result of the illuminating,
generating output responsive to the received light, the output including a plurality of parameter values measured for the parameters of the fabricated device, and
providing the output to a computer system of the metrology system for processing thereof including a spectra evaluation of the output to measure critical dimensions of the fabricated device; and the computer system for:
in response to the computer system receiving the output from the detector, identifying the first multi-dimensional library;
performing the processing of a first parameter value of the plurality of parameter values that is within the first multi-dimensional library to produce a spectra for the first parameter value using the first multi-dimensional library;
during the processing within the first multi-dimensional library, identifying a second parameter value of the plurality of parameter values that is within the second multi-dimensional library;
transitioning the processing to the second multi-dimensional library;
performing the processing of the second parameter value within the second multi-dimensional library to produce a spectra for the second parameter value using the second multi-dimensional library;
during the processing within the second multi-dimensional library, identifying a third parameter value of the plurality of parameter values that is within the third multi-dimensional library;
transitioning the processing to the third multi-dimensional library; and
performing the processing of the third parameter value within the third multi-dimensional library to produce a spectra for the third parameter value using the third multi-dimensional library.

9. The metrology system of claim 8, wherein the metrology system is a semiconductor metrology system.

10. The metrology system of claim 8, wherein each of the first multi-dimensional library and the second multi-dimensional library are constructed using one of finite element methods (FEM) and rigorous coupled-wave analysis (RCWA).

11. The metrology system of claim 10, wherein each of the first multi-dimensional library and the second multi-dimensional library are constructed with method parameters including one of a truncation order in RCWA and a polynomial order in FEM.

12. The metrology system of claim 8, wherein transitioning the processing to the second multi-dimensional library is performed using a predefined transition function.

13. The metrology system of claim 8, wherein the second multi-dimensional library is created as a supplement to the first multi-dimensional library.

* * * * *